United States Patent
Okita

(10) Patent No.: US 10,217,617 B2
(45) Date of Patent: Feb. 26, 2019

(54) PLASMA PROCESSING APPARATUS AND METHOD THEREFOR

(71) Applicant: Panasonic Intellectual Property Management Co., Ltd., Osaka (JP)

(72) Inventor: Shogo Okita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 35 days.

(21) Appl. No.: 14/525,712

(22) Filed: Oct. 28, 2014

(65) Prior Publication Data
US 2015/0126038 A1    May 7, 2015

(30) Foreign Application Priority Data
Nov. 1, 2013 (JP) ................................. 2013-228099

(51) Int. Cl.
*H01J 37/32*      (2006.01)
*H01L 21/67*      (2006.01)
(Continued)

(52) U.S. Cl.
CPC ...... *H01J 37/32724* (2013.01); *H01J 37/321* (2013.01); *H01J 37/32532* (2013.01);
(Continued)

(58) Field of Classification Search
CPC .......... H01J 37/32532; H01J 37/32724; H01J 37/32697; C23C 16/45597; C23C 16/4586; H01L 21/6836
(Continued)

(56) References Cited

U.S. PATENT DOCUMENTS

| | | | |
|---|---|---|---|
| 5,476,548 A | * | 12/1995 | Lei ..................... C23C 16/45521 118/500 |
| 2004/0261946 A1 | * | 12/2004 | Endoh ............... H01J 37/32082 156/345.15 |

(Continued)

FOREIGN PATENT DOCUMENTS

| | | | |
|---|---|---|---|
| JP | 4858395 | | 1/2012 |
| JP | 2012138440 A | * | 7/2012 |

OTHER PUBLICATIONS

Chinese Search Report dated May 21, 2017 issued in corresponding Chinese Patent Application No. 201410558116.7 (with English translation).

*Primary Examiner* — Charlee J C Bennett
(74) *Attorney, Agent, or Firm* — Wenderoth, Lind & Ponack, L.L.P.

(57) ABSTRACT

A dry etching apparatus plasma processes a wafer held by a carrier having a frame and a holding sheet. An electrode unit of a stage includes an electrostatic chuck. An area of an upper surface of the electrostatic chuck onto which the wafer is placed via the holding sheet is a flat portion and is not subject to backside gas cooling. A first groove structure is formed in the area onto which the wafer is placed via the holding sheet as well as in an area onto which a holding sheet between the wafer and the frame is placed. To a minute space defined by the first groove structure and the carrier, a heat transfer gas is supplied from a first heat transfer gas supply section through a heat transfer gas supply hole (backside gas cooling).

14 Claims, 8 Drawing Sheets

(51) Int. Cl.
*H01L 21/78* (2006.01)
*H01L 21/683* (2006.01)

(52) U.S. Cl.
CPC .. *H01J 37/32541* (2013.01); *H01L 21/67109* (2013.01); *H01L 21/6831* (2013.01); *H01L 21/6836* (2013.01); *H01L 21/78* (2013.01); *H01L 2221/68327* (2013.01)

(58) Field of Classification Search
USPC ..................................... 156/345.51–345.53
See application file for complete search history.

(56) References Cited

U.S. PATENT DOCUMENTS

| | | | | |
|---|---|---|---|---|
| 2010/0048001 | A1* | 2/2010 | Harikai | H01J 37/32743 438/464 |
| 2010/0216313 | A1 | 8/2010 | Iwai | |
| 2011/0083786 | A1* | 4/2011 | Guo | B32B 37/0007 156/64 |
| 2012/0238040 | A1* | 9/2012 | Kubota | H01J 37/32091 438/5 |
| 2012/0238073 | A1* | 9/2012 | Johnson | H01L 21/3065 438/464 |
| 2013/0009415 | A1* | 1/2013 | Goodman | H01L 21/67092 294/188 |
| 2013/0230974 | A1* | 9/2013 | Martinez | H01L 21/68771 438/464 |
| 2013/0295775 | A1 | 11/2013 | Iwai | |
| 2015/0059980 | A1* | 3/2015 | Okita | H01J 37/32477 156/345.51 |
| 2015/0122776 | A1* | 5/2015 | Okita | H01J 37/00 216/67 |
| 2015/0162169 | A1* | 6/2015 | Chen | H01J 7/32449 216/67 |
| 2015/0354060 | A1* | 12/2015 | Yabe | C23C 16/45544 216/62 |

* cited by examiner

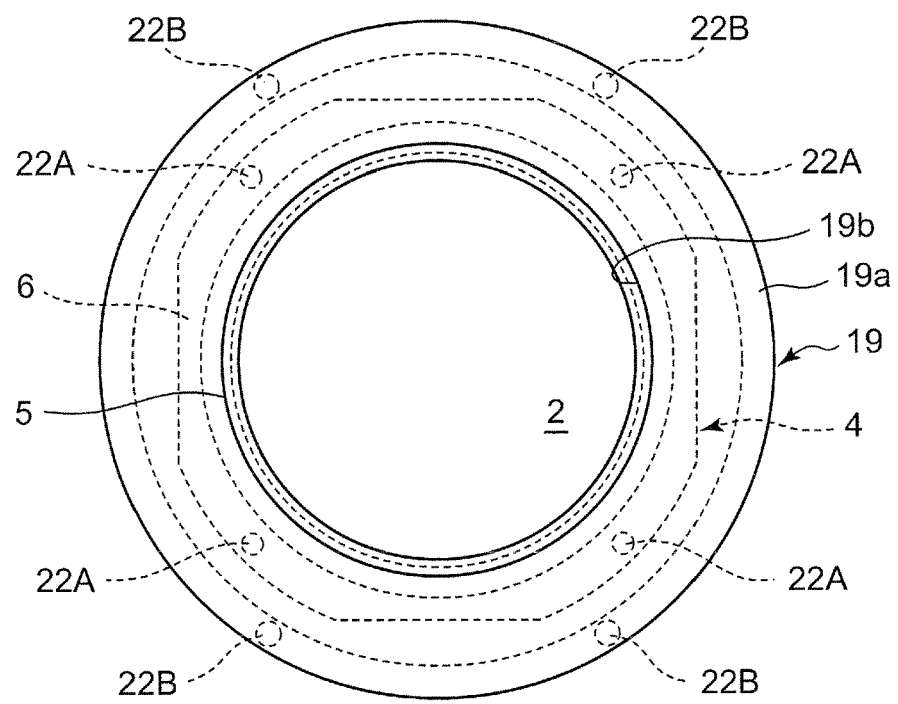
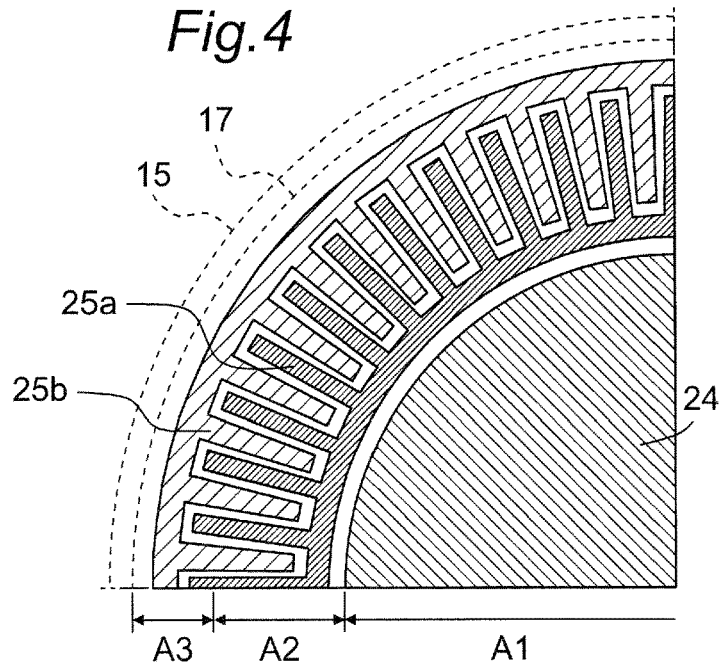

PLASMA PROCESSING APPARATUS AND METHOD THEREFOR

CROSS-REFERENCE TO RELATED APPLICATIONS

This application claims priority of Japanese Patent Application No. 2013-228099 filed on Nov. 1, 2013, the contents of which are incorporated herein by reference.

BACKGROUND OF THE INVENTION

Field of the Invention

The present invention relates to a plasma processing apparatus and a method therefor.

Description of Related Art

The plasma processing apparatuses disclosed in Japanese Patent No. 4858395 and United States Patent Application Publication No. 2012/0238073 have process targets of a substrate (wafer, for example) held in a carrier including an annular frame and a holding sheet. The substrate is held on a holding sheet. In addition, these plasma processing apparatuses include a cover that covers a frame and an area between the substrate outer-periphery of the holding sheet and the frame so that the frame and the area are not to be exposed to the plasma.

The cover is heated by being exposed to plasma, and tends to have a high temperature. Radiant heat from the heated cover gives thermal damage to the resist of the substrate outer peripheral part, holding sheet, and frame. As measures against the thermal damage by the radiant heat from such a cover, the substrate and the carrier are electrostatically attracted to and brought into close contact with the stage (cooled by coolant circulation), and can be cooled by the heat transfer to the stage. In order to improve heat transfer between the stage and the substrate placed on the stage, it is known to supply a heat transfer gas being a noble gas such as helium between the stage and the substrate (backside gas cooling).

In the conventional plasma processing apparatus, when the target of the plasma process is a substrate held by the carrier, there has not been any specific study on in what manner the back side gas cooling should be performed so that the plasma process performance and the cooling performance can be compatible.

SUMMARY OF THE INVENTION

The present invention has an object to improve both the plasma process performance and the cooling performance in a plasma processing apparatus for plasma-processing the substrate held by the carrier.

A first aspect of the present invention provides a plasma processing apparatus for plasma processing a substrate held by a carrier having a frame and a holding sheet comprising, a chamber having a pressure reducible internal space, a process gas supply section configured to supply a process gas into the internal space, a pressure reducing section configured to reduce pressure of the internal space, a plasma generating section configured to generate plasma in the internal space, a stage provided in the chamber and including an electrode unit on which the carrier is placed, a substantially flat portion provided in a first area of the electrode unit, the first area being an area in which the substrate is placed via the holding sheet, a first non-flat portion provided in a second area of the electrode unit, the second area including at least an area in which the frame is placed via the holding sheet and an area in which the holding sheet between the substrate and the frame is placed, the first non-flat portion having at least one concave portion recessed in a direction to be away from the carrier, and a first heat transfer gas supply section configured to supply a heat transfer gas to a first minute space defined between the first non-flat portion and the carrier.

Specifically, the plasma processing apparatus further comprises a cooling section configured to cool the electrode unit.

More specifically, the plasma processing apparatus further comprising a cover capable of coming into and out of contact with stage. The cover comprises a body covering the holding sheet and the frame of the carrier placed on the electrode unit, and a window formed to penetrate the body in a thickness direction so as to expose the substrate held in the carrier placed on the electrode unit to the internal space.

The backside gas cooling can achieve high cooling efficiency. However, the back side gas cooling has an unfavorable aspect with respect to the plasma process performance. For example, in the case of the process where the radical reaction is dominant at high plasma density and low bias power (Si etching process as one example of the plasma dicing, for example), a very small fluctuation of the bias power greatly influences the process property. When the substrate is divided into individual pieces, the strength of the substrate itself is reduced, and therefore deflection occurs in the holding sheet by the localized pressure difference of the heat transfer gas. This causes the degradation of the process property such as the fluctuation of the bias power and the shape abnormalities due to the fluctuation. In addition, the size of the chip obtained by the small pieces is so small that it can be smaller than a heat transfer gas supply section (heat transfer gas supply hole). Also in this case, the process property degradation occurs in the heat transfer gas supply holes.

In the present invention, the backside gas cooling is not applied to the substrate. In other words, the substantially flat portion is provided in the first area of the electrode unit in which the substrate is placed via the holding sheet. Herein, the term "substantially flat" means that it can be regarded as a flat surface except for a fine front-face roughness and unavoidable factors such as manufacturing tolerances.

In the present invention the backside gas cooling is applied to the frame and the holding sheet that do not remarkably affect the plasma processing apparatus. In other words, the first non-flat portion is provided in the second area of the electrode unit including at least the area in which the frame is placed via the holding sheet and the area in which the holding sheet between the substrate and the frame is placed. The heat transfer gas is supplied to the first non-flat portion from the first heat transfer gas supply section.

As explained above, the backside gas cooling not applied to the substrate but applied to the frame and the holding sheet can achieve enhanced performances in both of the plasma processing performance and a cooling performance. The enhanced cooling performance can effectively reduce thermal damages to the substrate, the holding sheet, and the frame due to a radiant heat from the cover.

The backside cooling can be applied to the cover. In this case, a second non-flat portion is provided in a third area of the electrode unit. The third area includes an area in which the cover comes into contact with the electrode unit. The second non-flat portion including at least one concave portion recessed in a direction to be away from the carrier. second heat transfer gas supply section is provided for supplying the heat transfer gas to a second minute space defined between the second non-flat portion and the cover.

Specifically, a first electrostatic attraction electrode is incorporated in the first area of the electrode unit.

Further, the plasma processing apparatus can be provided with a second electrostatic attraction electrode incorporated in the second area of the electrode unit. The frame and the holding sheet are electrostatically attracted onto the electrode unit and thereby a cooling efficiency of the frame and the holding sheet is improved.

The second electrostatic attraction electrode can extend to an area in which the cover comes into contact with the electrode unit. The cover is electrostatically attracted onto the electrode unit and thereby a cooling efficiency of the cover is improved.

Alternatively, the plasma processing apparatus can be provided with a clamp mechanism configured to press the cover onto the stage.

A DC voltage can be applied to the first electrostatic attraction electrode. A radio frequency voltage as a bias voltage can be superimposed on the DC voltage.

Advantageously, the first electrostatic attraction electrode is of unipolar type, whereas the second electrostatic attraction electrode is of bipolar type.

The electrostatic attraction electrode of unipolar type can uniformly attract the entire face of the substrate, and therefore, in terms of the plasma process performance, the electrostatic attraction electrode of unipolar type is superior to that of bipolar type. For example, in the case of plasma dicing, both the attraction force fluctuation of the before and after of singulating the substrate and the difference of the localized attraction force of unipolar type are less than those of bipolar type. The electrostatic attraction electrode of bipolar type is inferior to that of unipolar type in terms of the plasma process performance, but is stronger than that of unipolar type in terms of the electrostatic attraction force. The substrate is electrostatically attracted onto the electrode unit by the first electrostatic attraction electrode of unipolar type, whereas the frame and the holding sheet (a portion between the substrate and the frame) is electrostatically attracted onto the electrode unit by the second electrostatic attraction electrode of bipolar type. This arrangement can further improve both of the plasma processing performance and the cooling performance.

Both of the first and second electrostatic attraction electrodes can be of unipolar type. By adapting the unipolar type having simpler structure than that of the bipolar type as the first and second electrostatic attraction electrodes, the structure of the plasma processing apparatus can be simplified.

A second aspect of the present invention provides a method for plasma processing a substrate held by a carrier having a frame and a holding sheet. The method comprises loading the carrier holding the substrate into a chamber of a plasma processing apparatus, placing the substrate via the holding sheet on a substantially flat portion of the electrode, placing the frame via the holding sheet on a non-flat portion of the electrode unit, and placing the holding sheet between the substrate and the frame on the non-flat portion, the non-flat portion having at least one concave, the non-flat portion having at least one concave portion, and generating plasma in the chamber while supplying a heat transfer gas to a first minute space defined between the non-flat portion and the carrier, thereby plasma processing the substrate.

According to the invention, the substrate and the electrode unit are arranged in the flat portion and not subjected to the backside cooling. Contrarily, The frame and the holding sheet (the area between the substrate and the frame) are arranged in the first non-flat portion and subjected to the backside cooling. These enhance both of the plasma processing performance and the cooling performance of the plasma processing apparatus for processing the substrate held by the carrier.

BRIEF DESCRIPTION OF THE DRAWINGS

These and other objects and features of the present invention will become apparent from the following description taken in conjunction with preferred embodiments thereof with reference to the accompanying drawings, in which:

FIG. 3 is a plane view of a carrier arranged on a stage and the cover covering the carrier;

FIG. 4 is a partial enlarged view of first and second electrostatic attraction electrodes;

DESCRIPTION OF THE PREFERRED EMBODIMENTS

In the following, an embodiment of the present invention will be described with reference to the accompanying drawings. In the following description, terms indicating particular directions and positions (including such terms as "upper", "lower", "side", and "end") are sometimes used. The use of these terms are intended to facilitate the understanding of the present invention with reference to the drawings, and the technical scope of the present invention is not limited by the meaning of these terms. In addition, the following description is merely exemplary in nature, and it is not intended to limit the present invention, the application thereof, and the use thereof.

First Embodiment

Figure 1:
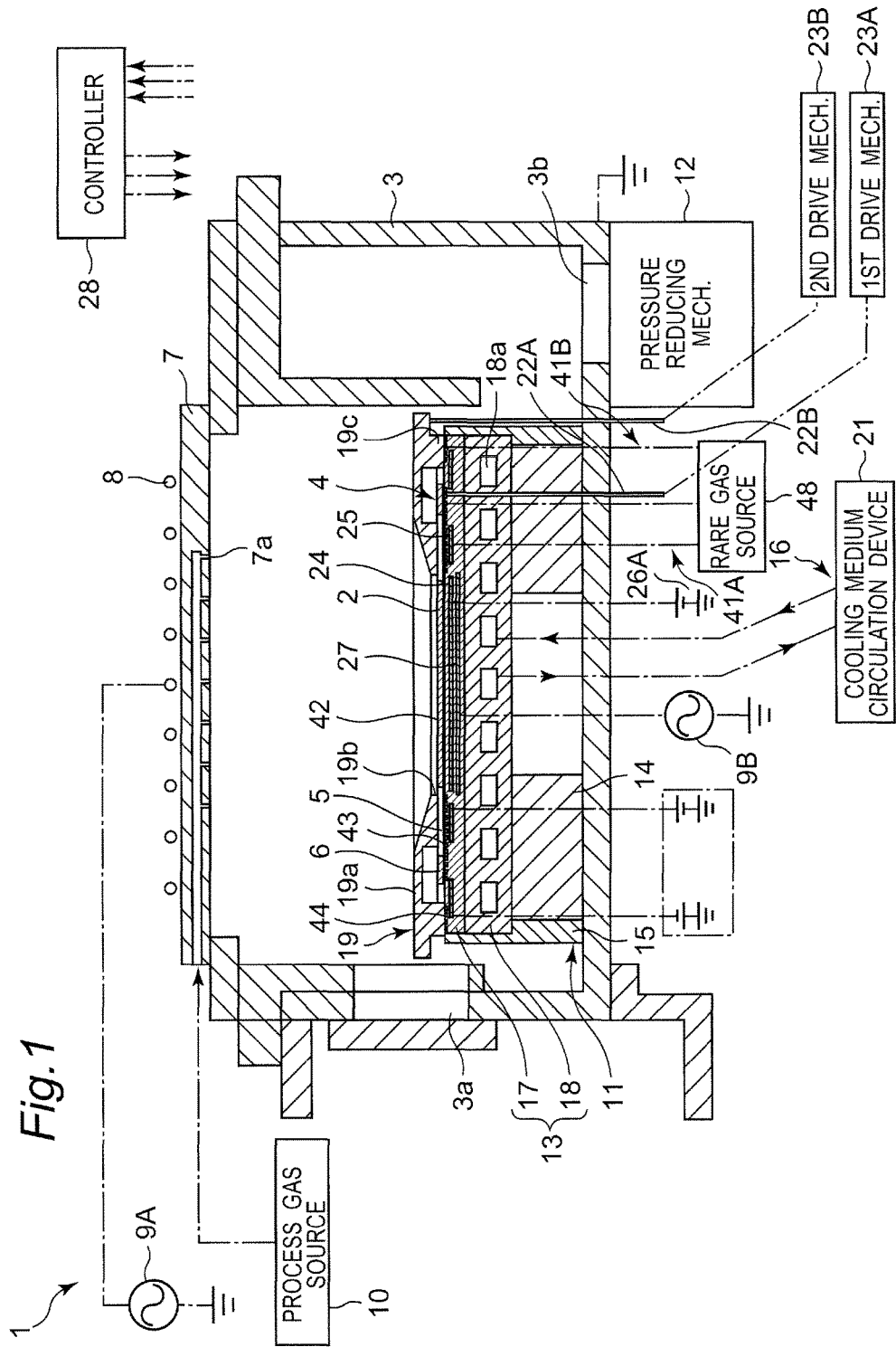
FIG. 1 is a sectional view of a plasma processing apparatus according to a first embodiment of the present invention (a cover is at a lowered position)
Figure 2:
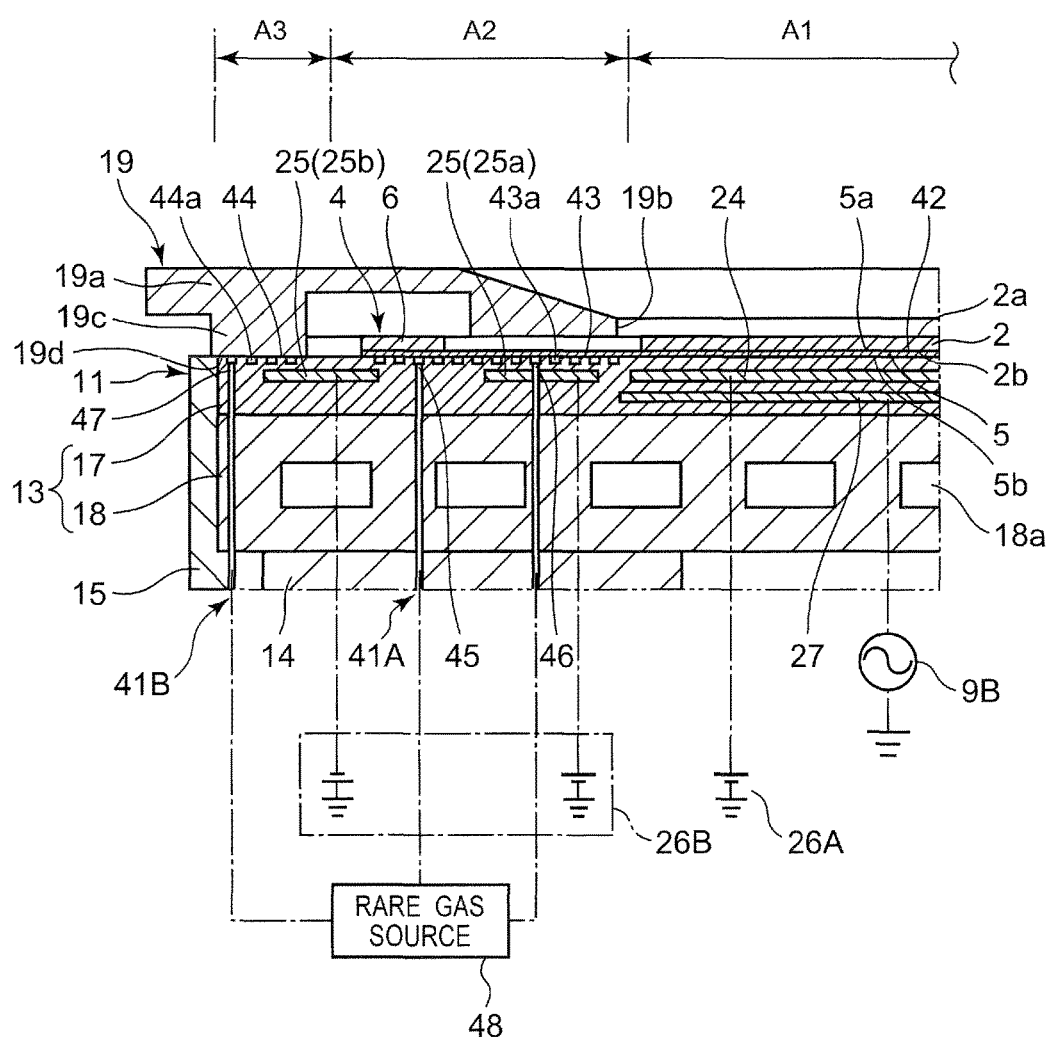
FIG. 2 is a partial enlarged view of FIG. 1.

FIGS. 1 to 4 show a dry etching apparatus 1 which is an example of a plasma processing apparatus according to an embodiment of the present invention. In this embodiment, plasma dicing is performed on a wafer (substrate) 2 by this dry etching apparatus 1. Plasma dicing is a method of cutting, by using a dry etching boundary line (street), the wafer 2 in which a plurality of IC units (semiconductor devices) are formed, and dividing the wafer 2 into individual IC units. Referring to FIG. 2, the wafer 2 having a circular shape in this embodiment includes a front face 2*a* on which IC units, etc., not shown in the figure, are formed, and a back face 2*b* (on which IC units, etc. are not formed) on the opposite side of the front face 2a. On the front face 2a of the wafer 2, a mask (not shown in the figure) is formed in a pattern for plasma dicing.

Referring to FIG. 1, the dry etching apparatus 1 includes a chamber (vacuum vessel) 3 which has a pressure reducible internal space. A carrier 4 can be accommodated in the internal space through a gate 3a of the chamber 3.

Referring to FIGS. 2 and 3, the carrier 4 includes a holding sheet 5 which detachably holds the wafer 2. As for the holding sheet 5, for example, a UV tape can be used. The UV tape is extendable and holds the wafer 2 by its adhesive force. However, the chemical properties of the UV tape are changed and the adhesive force is greatly reduced by irradiation of ultraviolet rays. The holding sheet 5 has an adhesive face 5a on one face, and a non-adhesive face 5b on the other face. The holding sheet 5 is flexible, flexes easily, and cannot maintain a constant shape only by itself. Therefore, on the adhesive face 5a near the outer peripheral edge of the holding sheet 5, an approximately annular thin frame 6 is adhered. The frame 6 is made of, for example, metal such as stainless steel, and aluminum, or resin, and has a rigidity that can hold the shape together with the holding sheet 5. In the holding sheet 5 in the carrier 4, the wafer 2 is held by the back face 2b being adhered on the adhesive face 5a.

Referring to FIG. 1, above the dielectric wall 7 that closes the top part of the chamber 3 of the dry etching apparatus 1, an antenna 8 is disposed as an upper part electrode. The antenna 8 is electrically connected to a first high frequency power source 9A. The antenna 8 and the first radio frequency power source 9A constitute a plasma generating section. On the bottom part side of the chamber 3, a stage 11 is disposed on which the carrier 4 holding the wafer 2 is placed. The gas inlet port 7a, which is formed in the dielectric wall 7, to the internal space of chamber 3 is connected to a process gas source 10. To the exhaust port 3b of the chamber 3, a pressure reducing mechanism 12 including a vacuum pump for evacuating the internal space is connected.

Referring to FIGS. 1 and 2, the stage 11 includes an electrode unit 13, a base section 14 supporting the electrode unit 13, and an exterior unit 15 surrounding the outer periphery of the electrode unit 13 and the base section 14. The exterior unit 15 is made of a ground shielding material (metal having conductivity and etching resistance). The exterior unit 15 protects the electrode unit 13 and the base section 14 from the plasma. A cooling device 16 is disposed in the stage 11.

The electrode unit 13 includes an electrostatic chuck 17 constituting the top layer of the stage 11, and an electrode unit body 18 made of metal such as aluminum alloy and disposed on the lower side of the electrostatic chuck 17.

The electrostatic chuck 17 of the electrode unit 13 is made of thin ceramics, sprayed ceramics, or a sheet (tape) of dielectric material. The carrier 4 holding the wafer 2 is placed on the central part of the upper face of the electrostatic chuck 17. In addition, on the outer peripheral side part of the electrostatic chuck 17, a cover 19 described below is placed. In the electrode unit 13, first and second electrostatic attraction electrodes 24 and 25 and a bias electrode 27 are incorporated. Heat transfer gas supply sections 41A and 41B are disposed so as to cool the carrier 4 placed on the electrostatic chuck 17 and the cover 19. The details of the electrostatic chuck 17 and the heat transfer gas supply sections 41A and 41B will be described later.

The cooling device (cooling section) 16 includes a coolant flow path 18a formed in the electrode unit body 18, and a coolant circulation device 21. The coolant circulation device 21 performs cooling by circulating the temperature-adjusted coolant in the coolant flow path 18a, and maintains the electrode unit 13 at a desired temperature.

The carrier 4 is placed on the electrode unit 13 of the stage 11 with the face holding the wafer 2 of the holding sheet 5 (adhesive face 5a) in an upward posture, and the non-adhesive face 5b of the holding sheet 5 comes into contact with the upper face of the electrode unit 13. The carrier 4 is placed in a predetermined position and posture with respect to the electrostatic chuck 17 of the electrode unit 13 by a conveyance mechanism not shown in the figure. Hereinafter, this predetermined position and posture are referred to as "normal position".

Figure 5:
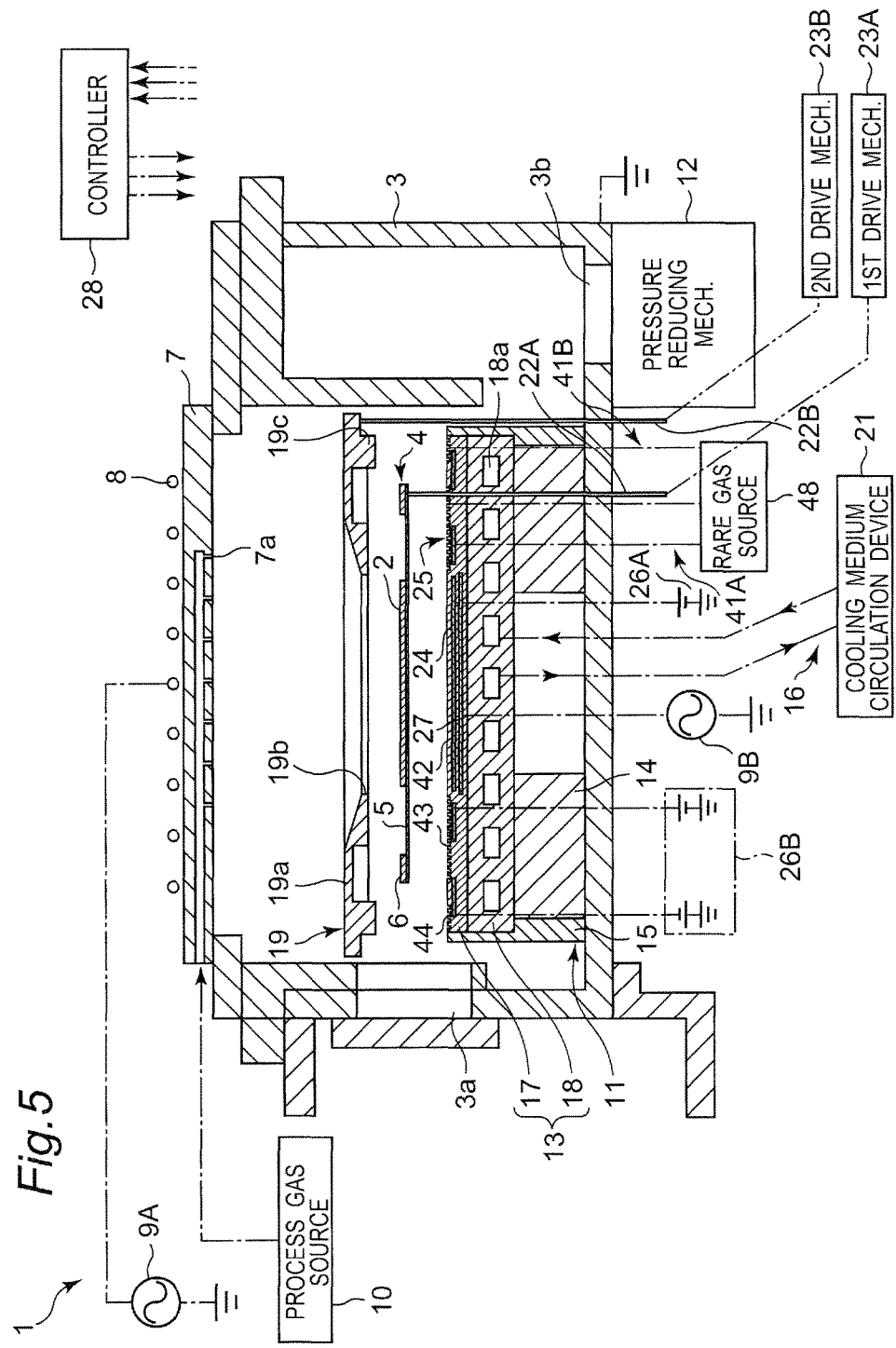
FIG. 5 is a sectional view of the plasma processing apparatus according to the first embodiment of the present invention (the cover is at a raised position)

The carrier 4 placed in the normal position is lifted by the first drive rod 22A and unloaded after the plasma process (See FIG. 5). The first drive rod 22A is vertically driven by the first drive mechanism 23A shown conceptually only in FIGS. 1 and 5. Specifically, the carrier 4 is made to move to the raised position shown in FIG. 5, and the lowered position shown in FIG. 1.

Referring to FIGS. 1 to 3, a cover 19 which moves up and down on the upper side of the stage 11 is disposed in the chamber 3. The cover 19 includes a body 19a having a thin circular outer contour, and a window 19b formed at the center of the body 19a so as to penetrate in the thickness direction. On the lower face of the body 19a, an annular protrusion portion 19c is formed so as to abut on the upper face of the electrostatic chuck 17 of the electrode unit 13 when the body 19a is lowered. The lower face of the annular protrusion portion 19c includes an annular contact face 19d having a predetermined width dimension in a radial direction. The cover 19 (body 19a) is made of a material such as a metal material including aluminum or aluminum alloy or the like, silicon carbide, aluminum nitride, and a ceramic material with excellent thermal conductivity.

The outer diameter dimension of the body 19a of the cover 19 is formed to be sufficiently larger than the outer contour of the carrier 4. The reason why the body 19a covers the frame 6 and the holding sheet 5 (area between the outer peripheral part of the wafer 2 and the frame 6) of the carrier 4 during the plasma process is to protect the frame 6 and the holding sheet 5 from the plasma. The diameter of the window 19b of the cover 19 is set, for example, in the range of ±2 mm with respect to the outer diameter dimension of the wafer 2. During the plasma process, the wafer 2 is exposed to the internal space of the chamber 3 through the window 19b.

The vertical movement operation of the cover 19 is performed by a second drive rod 22B connected to the body 19a. The second drive rod 22B is vertically driven by a second drive mechanism 23B shown conceptually only in FIGS. 1 and 5. The cover 19 is raised and lowered by the vertical movement of the second drive rod 22B. Specifically, the cover 19 can move to the raised position shown in FIG. 5 and the lowered position shown in FIG. 1.

Referring to FIG. 5, the cover 19 in the raised position is located with a sufficient distance above the stage 11. Thus, when the cover 19 is in the raised position, it is possible to perform the operation to load the carrier 4 (holding the wafer 2) on the upper face of the electrostatic chuck 17 of the electrode unit 13, and oppositely the operation to unload the carrier 4 from the upper face of the electrode unit 13.

Referring to FIGS. 1 and 2, the cover 19 in the lowered position covers the holding sheet 5 (except the part holding the wafer 2) and the frame 6 in the carrier 4 in the normal position. In addition, when the cover 19 is in the lowered position, the lower face of annular protrusion portion 19c

(the above-described contact face 19d) abuts on the upper face of the electrostatic chuck 17 of the electrode unit 13. That is, the second drive mechanism 23B functions as a means for raising and lowering the cover 19 with respect to the stage 11, and also functions as a means for making the cover 19 come into and out of contact with the stage 11.

In the following, referring to FIGS. 1 and 2, the electrostatic chuck 17 of the electrode unit 13 and the heat transfer gas supply sections 41A and 41B will be described. In the following description, unless specifically mentioned, the carrier 4 holding the wafer 2 is assumed to be in the normal position (a state of being placed on the electrostatic chuck 17 in a predetermined position and posture).

In the electrostatic chuck 17, in an adjacent area of the upper face of the central part, that is, the area in which the wafer 2 is placed via the holding sheet 5 (first area A1), a first electrostatic attraction electrode 24 of unipolar type is incorporated. As shown in FIG. 4, the first electrostatic attraction electrode 24 in this embodiment has a thin circular-disc shape with an outer diameter slightly larger than the wafer 2. A first DC power source 26A is electrically connected to the first electrostatic attraction electrode 24.

In the electrostatic chuck 17, a second electrostatic attraction electrode 25 of bipolar type in this embodiment is incorporated in an adjacent area of the upper face in the outer peripheral part surrounding the central part. Specifically, the second electrostatic attraction electrode 25 is incorporated in an area (second area A2) including the area in which the frame 6 is placed via the holding sheet 5 and the area in which the holding sheet 5 between the wafer 2 and the frame 6 and is placed, and in an area (third area A3) in which the annular protrusion portion 19c of the cover 19 in the lowered position abuts. As shown in FIG. 4, the second electrostatic attraction electrode 25 includes an endless-shaped positive electrode 25a surrounding the first electrostatic attraction electrode 24, and an endless-shaped negative electrode 25b disposed outside the positive electrode 25a. The positive electrode 25a is electrically connected to the positive electrode of a second DC power source 26B, and the negative electrode 25b is electrically connected to the negative electrode of the second DC power source 26B. In this embodiment, both the positive electrode 25a and the negative electrode 25b of the second electrostatic attraction electrode have strip shapes that meander with constant widths.

In the electrostatic chuck 17, a bias electrode 27 is incorporated below the first electrostatic attraction electrode 24. The bias electrode 27 is electrically connected to the second radio frequency power source 9B for applying a bias voltage.

On the upper face of the electrostatic chuck 17, in the first area A1 in which the wafer 2 is placed via the holding sheet 5, a flat portion 42 which is substantially flat is disposed. Here, the term "substantially flat" means that it can be regarded as a flat surface except for a fine front-face roughness and unavoidable factors such as manufacturing tolerances.

On the upper face of the electrostatic chuck 17, in the second area A2 including the area in which the frame 6 is placed via the holding sheet 5, and the area in which the holding sheet 5 between the wafer 2 and the frame 6 is placed, a first groove structure portion (first non-flat portion) 43 is disposed. The first groove structure portion 43 includes a plurality of first grooves (concave portion) 43a recessed downward (in the direction to be away from the carrier 4) from the upper face of the electrostatic chuck 17, and communicating fluidly with each other. In the electrostatic chuck 17, heat transfer gas supply holes 45 and 46 are disposed in the part in which the first groove structure portion 43 is disposed. The heat transfer gas supply hole 45 is disposed in a position facing the frame 6, and the heat transfer gas supply hole 46 is disposed in a position corresponding to the holding sheet 5 between the wafer 2 and the frame 6. The heat transfer gas supply holes 45 and 46 are fluidly connected to a noble gas source 48. The noble gas source 48 supplies a heat transfer gas which is a noble gas such as helium. The first heat transfer gas supply section 41A includes the heat transfer gas supply holes 45 and 46 and the noble gas source 48.

By the first groove structure portion 43 and the carrier 4 which is placed on the electrostatic chuck 17 (the part in which the frame 6 is fixed and the part between the wafer 2 and the frame 6 in the holding sheet 5), minute space (first minute space) is formed. Into this minute space, the heat transfer gas from the noble gas source 48 is released via the heat transfer gas supply holes 45 and 46.

On the upper face of the electrostatic chuck 17, in the third area A3 in which the contact face 19d of the annular protrusion portion 19c of the cover 19 in the lowered position abuts, a second groove structure portion (second non-flat portion) 44 is disposed. The second groove structure portion 44 includes a plurality of second grooves (concave portion) 44a recessed downward (in the direction to be away from the carrier 4) from the upper face of the electrostatic chuck 17, and communicating fluidly with each other. In the electrostatic chuck 17, in the part in which the second groove structure portion 44 is disposed, a heat transfer gas supply hole 47 is disposed. The heat transfer gas supply hole 47 is fluidly connected to the noble gas source 48. The second heat transfer gas supply mechanism 41 includes the heat transfer gas supply hole 47 and the noble gas source 48.

By the second groove structure portion 44 and the contact face 19d of the annular protrusion portion 19c of the cover 19 which abuts on the electrostatic chuck 17, minute space (second minute space) is formed. Into this minute space, the heat transfer gas from the noble gas source 48 is released via the heat transfer gas supply hole 47.

The controller 28 schematically shown in FIGS. 1 and 5 controls the operation of the each element which constitutes the dry etching apparatus 1. These elements include the first and second radio frequency power sources 9A and 9B, the process gas source 10, the pressure reducing mechanism 12, the first and second dc power sources 26A and 26B, the coolant circulation device 21, the first and second drive mechanisms 23A and 23B, and the noble gas source 48 of the first and second heat transfer gas supply sections 41A and 41B.

Next, the operation of the dry etching apparatus 1 in this embodiment will be described.

First, the carrier 4 where the wafer 2 is adhered in the center of the holding sheet 5 is loaded to the internal space of the chamber 3, and placed in the normal position on the electrostatic chuck 17 by the conveyance mechanism not shown in the figure. In this case, the cover 19 is in the raised position (FIG. 5).

The second drive rod 22B is driven by the second drive mechanism 23B, and the cover 19 is lowered from the raised position (FIG. 5) to the lowered position (FIG. 1). When the cover 19 is in the lowered position, the frame 6 and the holding sheet 5 (the area between the wafer 2 and the frame 6) of the carrier 4 are covered with the cover 19, and wafer 2 is exposed through the window 19b. In addition, the lower end face of the annular protrusion portion 19c of the cover 19 (contact face 19d) comes into contact with the upper face of the electrostatic chuck 17 (third area A3).

A direct current voltage is applied from the first DC power source 26A to the first electrostatic attraction electrode 24 of unipolar type, and the wafer 2 is held on the upper face of the electrostatic chuck 17 via the holding sheet 5 by the electrostatic attraction. In addition, a direct current voltage is applied from the second DC power source 26B to the second electrostatic attraction electrode 25 of bipolar type, and the frame 6 and the holding sheet 5 (the area between the wafer 2 and the frame 6) are held on the upper face of the electrostatic chuck 17 by the electrostatic attraction. In addition, by applying a direct current voltage from the second DC power source 26B to the bipolar second electrostatic attraction electrode 25, the cover 19 is electrostatically attracted to the upper face of the electrostatic chuck 17. In other words, the cover 19 is pressed onto the upper face of the electrostatic chuck 17 by the electrostatic attraction force.

In addition, by the first heat transfer gas supply section 41A, the heat transfer gas from the noble gas source 48 is supplied via the heat transfer gas supply holes 45 and 46 to the first minute space defined by the first groove structure portion 43 and the carrier 4 (the part in which the frame 6 is fixed and the part between the wafer 2 and the frame 6 in the holding sheet 5) placed on the electrostatic chuck 17. The heat transfer gas is filled in the first minute space.

Furthermore, by the second heat transfer gas supply section 41B, the heat transfer gas from the noble gas source 48 is supplied via the heat transfer gas supply hole 47 to the second minute space defined by the second groove structure portion 44 and the annular protrusion portion 19c of the cover 19 which abuts on the electrostatic chuck 17. The heat transfer gas is filled in the second minute space.

Next, the process gas for plasma dicing is introduced to the chamber 3 from the process gas source 10, and at the same time, discharged by the pressure reducing mechanism 12 to maintain the inside of the chamber 3 at a predetermined pressure. After that, radio frequency power is supplied to the antenna 8 from the first radio frequency power source 9A to generate plasma inside the chamber 3, and the generated plasma is applied to the wafer 2 exposed through the window 19b of the cover 19. In this case, a bias voltage is applied from the second radio frequency power source 2B to the bias electrode 27. In addition, the cooling device 16 cools the stage 11 including the electrode unit 13. A part of the wafer 2, the part exposed through the mask (street), is removed in the front face 2a to the back face 2b by physicochemical action of radicals and ions in the plasma, and the wafer 2 is divided into individual chips (individual pieces).

During the plasma dicing, the cover 19 is heated by exposure to plasma. However, the cover 19 is made of a material having high thermal conductivity, and the annular protrusion portion 19c is pressed onto the upper face of the electrostatic chuck 17 by the electrostatic attraction of the second electrostatic attraction electrode 25. Therefore, the heat generated in the cover 19 can be released to the stage 11 cooled by the cooling device 16. In other words, during the plasma dicing, the cover 19 is cooled by the heat conduction to the stage 11. In addition, between the cover 19 and the electrostatic chuck 17, the heat transfer gas supplied to the second groove structure portion 44 is present by the second heat transfer gas supply section 41B (back side gas cooling), and the heat of the cover 19 can be released to the stage 11 with a high heat transfer efficiency.

During the plasma dicing, the wafer 2 is electrostatically attracted to the upper face of the electrostatic chuck 17 by the first electrostatic attraction electrode 24 via the holding sheet 5. Therefore, during the plasma dicing, the heat generated in the wafer 2 can be released to the stage 11 cooled by the cooling device 16. In other words, during the plasma dicing, the wafer 2 is cooled by the heat conduction to the stage 11. However, the backside gas cooling is not applied to an interface between the wafer 2 and the electrostatic chuck 17.

During the plasma dicing, the frame 6 and the holding sheet 5 are electrostatically attracted to the upper face of the electrostatic chuck 17 by the second electrostatic attraction electrode 25. Therefore, during the plasma dicing, the heat generated in the frame 6 and the holding sheet 5 can be released to the stage 11 cooled by the cooling device 16. In other words, during the plasma dicing, the frame 6 and the holding sheet 5 are cooled by the heat conduction to the stage 11. In addition, between the frame 6 and the holding sheet 5 and between the holding sheet 5 and the electrostatic chuck 17, the heat transfer gas supplied to the first groove structure portion 43 is present by the first heat transfer gas supply section 41A (back side gas cooling), and the heat of the cover 19 can be released to the stage 11 with a high heat transfer efficiency.

As described above, the cover 19 itself heated by being exposed to plasma is cooled by the heat transfer to the stage 11, and in addition, the wafer 2, the frame 6, and the holding sheet 5 are also cooled by the heat transfer to the stage 11, and thereby, the thermal damage to the carrier 4 (sheet, frame, and wafer) by the radiant heat from the cover 19 can be effectively prevented. Specifically, the cover 19, the frame 6, and the holding sheet 5 can be cooled with higher efficiency because the back side gas cooling is applied to them.

After the plasma dicing, the second drive rod 22B is driven by the second drive mechanism 23B, and the cover 19 is moved from the lowered position to the raised position. Then, the first drive rod 22A is driven by the first drive mechanism 23A, the carrier 4 is moved from the lowered position to the raised position, and the carrier 4 is conveyed from the chamber 3 by the conveyance mechanism not shown in the figure.

In this embodiment, the wafer 2 is disposed on the flat portion 42 of the electrostatic chuck 17, and the back side cooling is not applied to the wafer 2. On the other hand, the frame 6 and the holding sheet 5 (the area between the wafer 2 and the frame 6) are disposed on the first groove structure portion 43, and the back side cooling is applied to the frame 6 and the holding sheet 5, and whereby both the plasma process performance and the cooling performance are improved. In the following, the details on this point will be described.

The backside gas cooling can achieve high cooling efficiency. However, the back side gas cooling has an unfavorable aspect with respect to the plasma process performance. For example, in the case of the process where the radical reaction is dominant at high plasma density and low bias power (Si etching process as one example of the plasma dicing, for example), a very small fluctuation of the bias power greatly influences the process property. When the wafer 2 is divided into individual pieces, the strength of the wafer 2 itself is reduced, and therefore deflection occurs in the holding sheet 5 by the localized pressure difference of the heat transfer gas. This causes the degradation of the process property such as the fluctuation of the bias power and the shape abnormalities due to the fluctuation. In addition, the size of the chip obtained by the small pieces is so small that it can be smaller than a heat transfer gas supply hole (a hole of the same size as the heat transfer gas supply holes 45 to 47 in this embodiment, for example). Also in this case, the process property degradation occurs in the heat transfer gas supply holes.

Thus, the backside gas cooling is not applied to the wafer 2, but is applied to the frame 6 and the holding sheet 5, and whereby both the plasma process performance and the cooling performance can be improved. With the improvement of the cooling performance, the damage to the wafer 2, the holding sheet 5, and the frame 6 caused by the radiant heat from the cover 19 can be effectively reduced.

In this embodiment, as described above, the first electrostatic attraction electrode 24 of unipolar type is used for the electrostatic attraction of the wafer 2, on the other hand, the second electrostatic attraction electrode 25 of bipolar type is used for the electrostatic attraction of the carrier 4 (the frame 6 and the holding sheet 5) and the cover 19. This also improves both the plasma process performance and the cooling performance. In the following, the details on this point will be described.

The wafer 2 is electrostatically attracted to the electrostatic chuck 17 by the first electrostatic attraction electrode 24 of unipolar type. The electrostatic attraction electrode of unipolar type electrostatically attracting mainly by Coulomb force has a weaker electrostatic attraction force than that of bipolar type. However, the electrostatic attraction electrode of unipolar type can uniformly attract the entire face of the wafer, and therefore, in terms of the plasma process performance, the electrostatic attraction electrode of unipolar type is superior to that of bipolar type which performs electrostatic attraction by Johnsen-Rahbek force due to the current mainly flowing through the back face of the holding sheet 5 and the wafer 2. For example, in the case of plasma dicing, both the attraction force fluctuation of the before and after of singulating the wafer 2 and the difference of the localized attraction force of unipolar type are less than those of bipolar type. In addition, specifically, in the case of the process (Si etching process, for example) where the radical reaction of the high plasma density and the low bias power are dominant, with the change of the bias power of the before and after of singulating the wafer 2, the pattern of the electrostatic attraction electrode of bipolar type may be transcribed to the substrate side. On the other hand, the frame 6 and the cover 19 are electrostatically attracted to the electrostatic chuck 17 by the second electrostatic attraction electrode 25 of bipolar type. The electrostatic attraction electrode of bipolar type is inferior to that of unipolar type in terms of the plasma process performance, but is stronger than that of unipolar type in terms of the electrostatic attraction force. That is, in the present invention, the first electrostatic attraction electrode 24 of unipolar type is used for the electrostatic attraction of the wafer 2 which directly influences the plasma process performance, on the other hand, the second electrostatic attraction electrode 25 of bipolar type with the strong electrostatic attraction force is used for the conveyance frame 6 and the cover 19 with less influence on the plasma process performance than the wafer 2. As a result, both the plasma process performance and the electrostatic attraction performance can be improved. With the improvement of the electrostatic attraction performance, the carrier 4 and the cover 19 are cooled effectively by the heat transfer to the stage, and the damage caused by the radiant heat from the cover 19 can be reduced effectively.

In the following, other embodiments of the present invention will be described. The configuration and the operation not specifically mentioned in the description of these embodiments are the same as those of the first embodiment.

Second Embodiment

Figure 6:
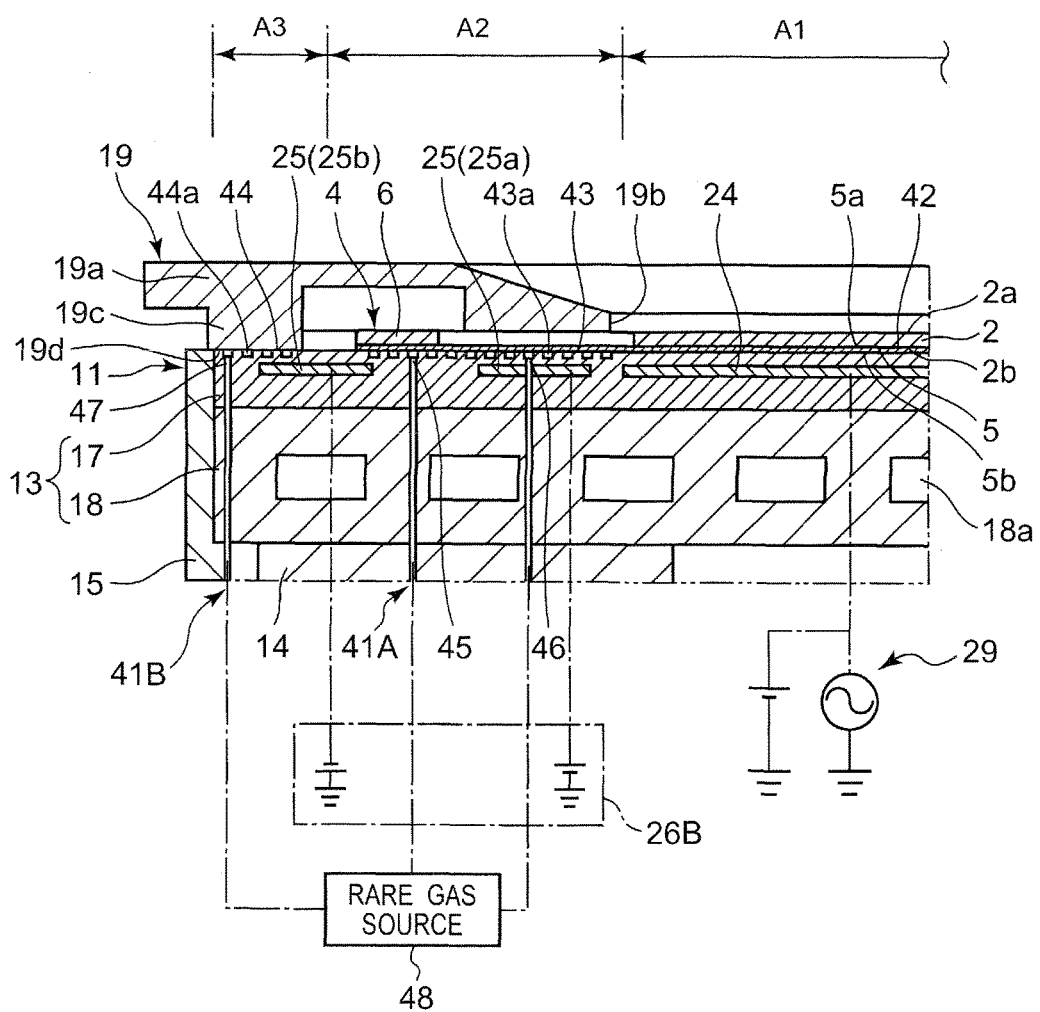
FIG. 6 is a partial sectional view of a plasma processing apparatus according to a second embodiment of the present invention.

In the second embodiment shown in FIG. 6, the bias electrode 27 and the second radio frequency power source 9B are eliminated, and a voltage obtained by superimposing a radio frequency voltage as a bias voltage on a direct current voltage is applied from the power source 29 to the first electrostatic attraction electrode 24. By eliminating the second radio frequency power source 9B, the configuration of the electrostatic chuck 17 can be simplified.

Third Embodiment

Figure 7:
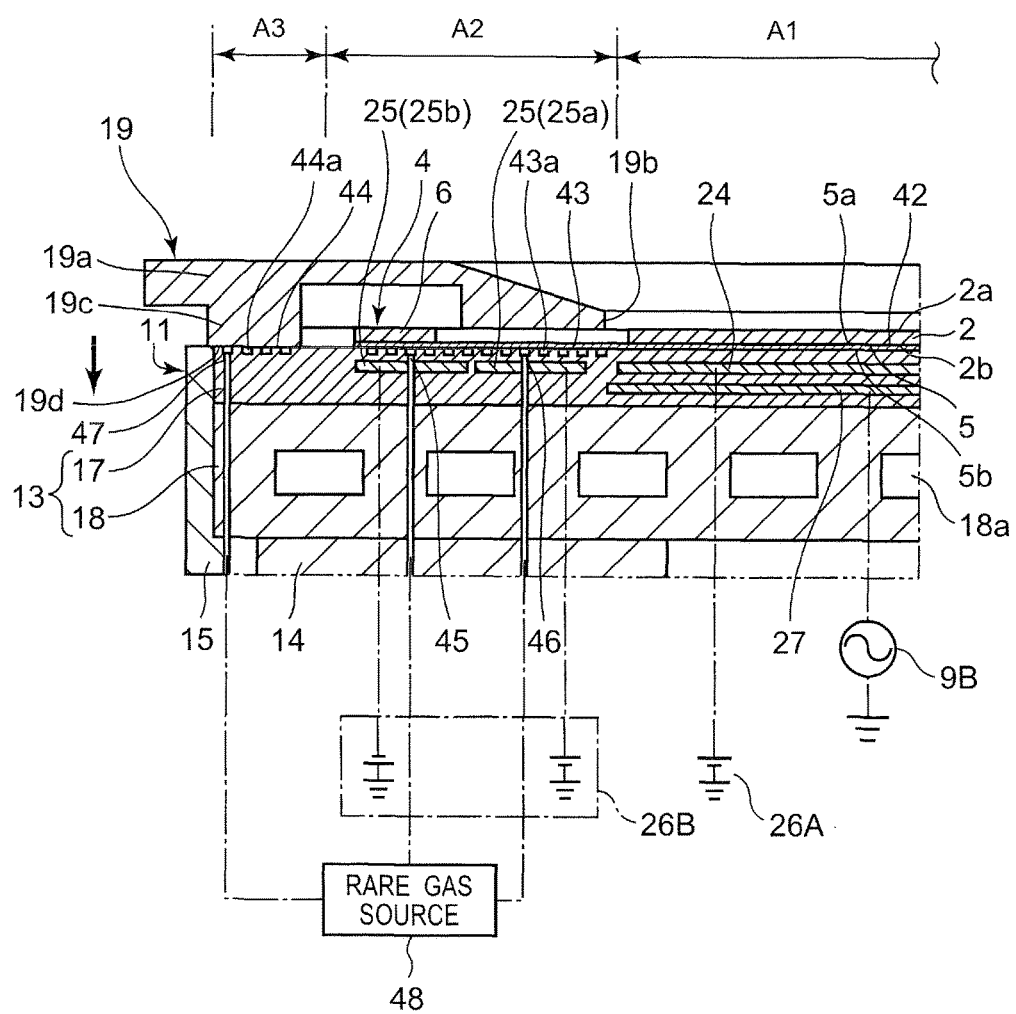
FIG. 7 is a partial sectional view of a plasma processing apparatus according to a third embodiment of the present invention.

In the third embodiment shown in FIG. 7, the second electrostatic attraction electrode 25 is disposed only in the second area A2 including the area in which the frame 6 is placed via the holding sheet 5 and the area which is between the wafer 2 and the frame 6 and in which the holding sheet 5 is placed in the electrostatic chuck 17. In other words, the second electrostatic attraction electrode 25 is not disposed in the third area A3 in which the cover 19 in the lowered position abuts in the electrostatic chuck 17, and the cover 19 is not electrostatically attracted to the electrostatic chuck 17. During the plasma process, the cover 19 is urged to the stage 11 side by the second drive mechanism 23B, and whereby the contact face 19d of the annular protrusion portion 19c is pressed onto the upper face of the electrostatic chuck 17.

Fourth Embodiment

Figure 8:
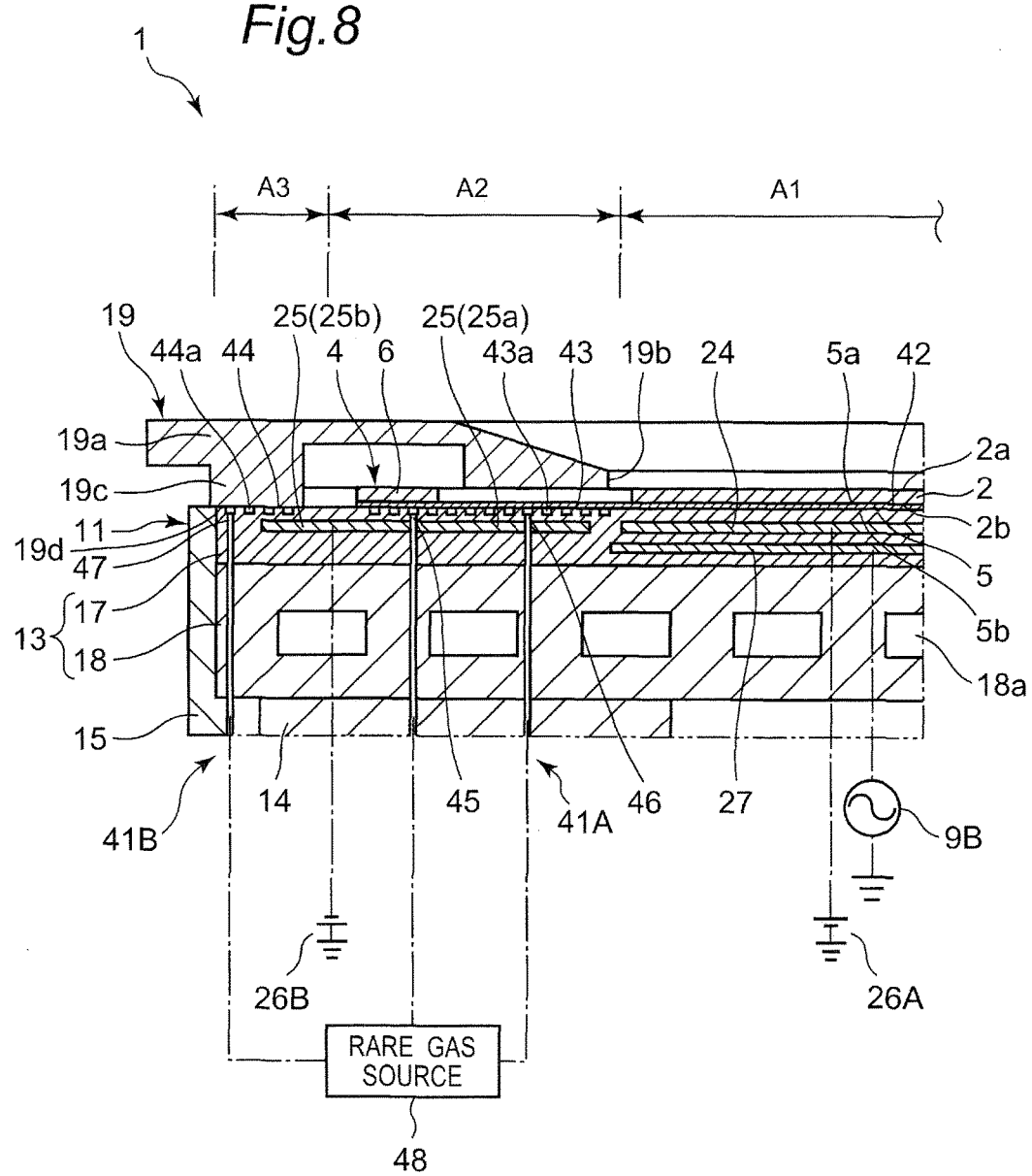
FIG. 8 is a partial sectional view of a plasma processing apparatus according to a fourth embodiment of the present invention.

In the fourth embodiment shown in FIG. 8, the second electrostatic attraction electrode 25 is of unipolar type. In general, the electrostatic attraction electrode of unipolar type has a simpler configuration than the electrostatic attraction electrode of the bipolar type. By using unipolar type for both the first electrostatic attraction electrode 24 and the second electrostatic attraction electrode 25, the configuration of the electrostatic chuck 17 can be simplified. When both the first and the second electrostatic attraction electrodes 24 and 25 are of unipolar type, a direct current voltage may be applied to the DC power source common to these respective power sources. With such power sources in common, the configuration of the electrostatic chuck 17 can be further simplified.

Fifth Embodiment

Figure 9:
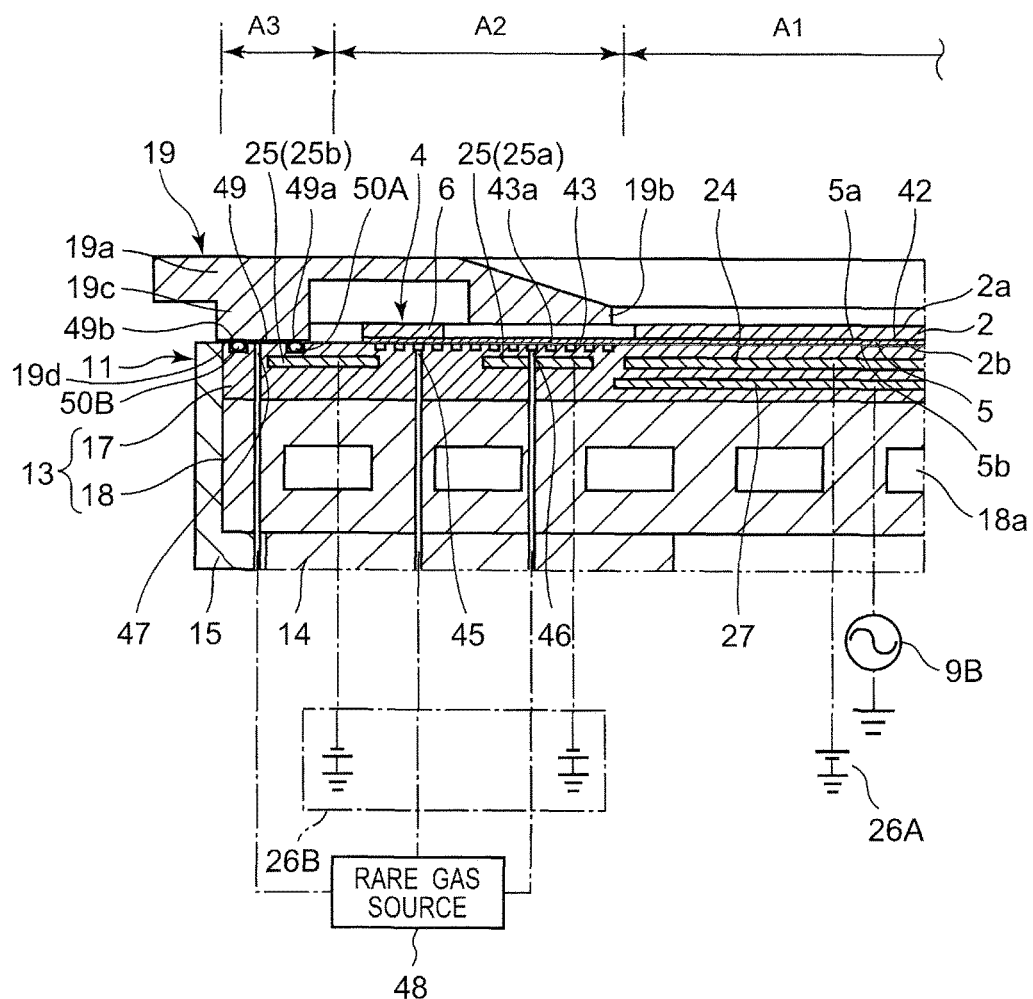
FIG. 9 is a partial sectional view of a plasma processing apparatus according to a fifth embodiment of the present invention.

In the fifth embodiment shown in FIG. 9, on the upper face of the electrostatic chuck 17, the second groove structure portion 44 (see FIG. 2) is eliminated from the third area A3 in which the contact face 19d of the annular protrusion portion 19c of the cover 19 in the lowered position abuts, and a flat face 49 is obtained. In the accommodation grooves 49a and 49b provided in the flat face 49, O-rings 50A and 50B, each of which is an example of a seal member, are accommodated. Minute space is defined by the lower end of the annular protrusion portion 19c of the cover 19 in the lowered position, the flat face 49, and the O-rings 50A and 50B, and the heat transfer gas from the noble gas source 48 is supplied to this minute space by the second heat transfer gas supply section 41B via the heat transfer gas supply hole 47.

The present invention is not limited to the configurations in the embodiments, and various modifications are possible.

For example, by raising and lowering the stage 11 with respect to the cover 19 which is fixed in the chamber 3, a configuration that the cover 19 comes into and out of contact with the stage 11 can be adopted.

In addition, the present invention is described using a dry etching apparatus of ICP type as an example, but the present invention can also be applied to a dry etching apparatus of parallel-plate type. In addition, the present invention can also be applied to other plasma processing apparatuses such as a CVD apparatus limited to the dry etching apparatus.

What is claimed is:

1. A plasma processing apparatus for plasma processing a substrate held by a carrier having a frame and a holding sheet, comprising:
    a chamber having a pressure reducible internal space;
    a process gas supply section configured to supply a process gas into the internal space;
    a pressure reducing section configured to reduce pressure of the internal space;
    a plasma generating section configured to generate plasma in the internal space;
    a stage in the chamber and including an electrode unit on which the carrier is positioned;
    a substantially flat portion in a first area of the electrode unit, the first area being an area in which the substrate is positioned via the holding sheet;
    a first non-flat portion in a second area of the electrode unit, the second area including at least an area in which the frame is positioned via the holding sheet and an area in which the holding sheet between the substrate and the frame is positioned, the first non-flat portion having at least one concave portion recessed in a direction away from the carrier; and
    a first heat transfer gas supply section configured to supply a heat transfer gas to a first minute space defined between the first non-flat portion and the carrier via at least one heat transfer gas supply hole,
    wherein the at least one heat transfer gas supply hole is in the second area of the electrode unit and no heat transfer gas hole is in the first area of the electrode unit, and
    wherein the substantially flat portion has no concave portion recessed in the direction away from the carrier, and the substantially flat portion has no concave portion formed by any heat transfer gas supply hole.

2. The plasma processing apparatus according to claim 1, further comprising a cover capable of coming into and out of contact with the stage, the cover comprising:
    a body covering the holding sheet and the frame of the carrier positioned on the electrode unit; and
    a window formed to penetrate the body in a thickness direction so as to expose the substrate held in the carrier positioned on the electrode unit to the internal space.

3. The plasma processing apparatus according to claim 2, further comprising:
    a second non-flat portion in a third area of the electrode unit, the third area including an area in which the cover comes into contact with the electrode unit, the second non-flat portion including at least one concave portion recessed in the direction away from the carrier; and
    a second heat transfer gas supply section configured to supply the heat transfer gas to a second minute space defined between the second non-flat portion and the cover.

4. The plasma processing apparatus according to claim 1, further comprising a cooling section configured to cool the electrode unit.

5. The plasma processing apparatus according to claim 1, further comprising a first electrostatic attraction electrode in the first area of the electrode unit.

6. The plasma processing apparatus according to claim 5, further comprising a second electrostatic attraction electrode in the second area of the electrode unit.

7. The plasma processing apparatus according to claim 6, wherein the second electrostatic attraction electrode is electrically independent from the first electrostatic attraction electrode.

8. The plasma processing apparatus according to claim 7, wherein the second electrostatic attraction electrode extends to an area in which a cover comes into contact with the electrode unit.

9. The plasma processing apparatus according to claim 7, wherein:
    the first electrostatic attraction electrode is of unipolar type, and
    the second electrostatic attraction electrode is of bipolar type.

10. The plasma processing apparatus according to claim 5, wherein a direct current voltage is applied to the first electrostatic attraction electrode.

11. The plasma processing apparatus according to claim 5, wherein the substantially flat portion covers the first area and the first electrostatic attraction electrode entirely.

12. The plasma processing apparatus according to claim 1, wherein a top surface of the substantially flat portion and a top surface of the first non-flat portion are positioned at a same height.

13. A plasma processing apparatus for plasma processing a substrate held by a carrier having a frame and a holding sheet, comprising:
    a chamber having a pressure reducible internal space;
    a process gas supply section configured to supply a process gas into the internal space;
    a pressure reducing section configured to reduce pressure of the internal space;
    a plasma generating section configured to generate plasma in the internal space;
    a stage in the chamber and including an electrode unit on which the carrier is positioned;
    a cover comprising a body covering the holding sheet and the frame of the carrier positioned on the electrode unit, and a window formed to penetrate the body in a thickness direction of the body so as to expose the substrate held in the carrier positioned on the electrode unit to the internal space;
    a substantially flat portion in a first area of the electrode unit, the first area being an area exposed through the window of the cover;
    a first non-flat portion in a second area of the electrode unit, the second area including at least an area covered by the body of the cover, the first non-flat portion having at least one concave portion recessed in a direction away from the carrier; and
    a heat transfer gas supply section configured to supply a heat transfer gas to a first minute space defined between the first non-flat portion and the carrier via at least one heat transfer gas supply hole,
    wherein the at least one heat transfer gas supply hole is in the second area of the electrode unit and no transfer gas hole is in the first area of the electrode unit, and
    wherein the substantially flat portion has no concave portion recessed in the direction away from the carrier, and the substantially flat portion has no concave portion formed by any heat transfer gas supply hole.

14. The plasma processing apparatus according to claim 13, wherein a top surface of the substantially flat portion and a top surface of the first non-flat portion are positioned at a same height.

* * * * *